United States Patent [19]
Nakanishi et al.

[11] Patent Number: 4,937,568
[45] Date of Patent: Jun. 26, 1990

[54] SIGNAL SERIAL/PARALLEL CONVERSION SYSTEM

[75] Inventors: Koji Nakanishi, Asahi; Yoshitane Saito, Nagaokakyo, both of Japan

[73] Assignees: Kuroda Precision Industries, Ltd., Kanagawa; Nakamura Engineering Co., Ltd., Kyoto, both of Japan

[21] Appl. No.: 237,387

[22] Filed: Aug. 26, 1988

[30] Foreign Application Priority Data

Sep. 14, 1987 [JP]  Japan .................. 62-229978

[51] Int. Cl.$^5$ .................. H04Q 5/00; H04B 3/54
[52] U.S. Cl. .................. 340/825.06; 340/310 A; 328/105
[58] Field of Search .................. 377/2; 328/105; 340/825.06, 310, 310 A

[56]  References Cited
U.S. PATENT DOCUMENTS

| | | | |
|---|---|---|---|
| 3,743,948 | 7/1973 | Dahlin .................. | 328/105 |
| 3,774,056 | 11/1973 | Sample et al. .................. | 377/2 |
| 4,237,371 | 12/1980 | LeBouder .................. | 377/2 |
| 4,304,989 | 12/1981 | Vos et al. .................. | 377/2 |
| 4,419,667 | 12/1983 | Gurr et al. .................. | 340/825.06 |
| 4,446,458 | 5/1984 | Cook .................. | 340/825.06 |
| 4,728,948 | 3/1988 | Fields .................. | 340/825.06 |
| 4,800,363 | 1/1989 | Braun et al. .................. | 340/310 A |
| 4,811,561 | 3/1989 | Edwards et al. .................. | 340/825.06 |

Primary Examiner—John S. Heyman
Attorney, Agent, or Firm—McGlew & Tuttle

[57]  ABSTRACT

A remote control system comprises a central control station and at least one local station installed remotely from the central control station and connected thereto through a power transmission line. The local station has a plurality to devices connected in parallel to one another at the output. The power for actuating the devices is supplied from the central control station. For controlling actuation of the devices, binary control signals are serially sent from the central control station to the local station through the power transmission line in synchronism with clock pulses in a train including a start pulse. In the local station, the binary control signal are extracted in response to the start signal and converted into parallel control signals by utilizing the clock pulses to be applied to output circuits provided for controlling the devices.

11 Claims, 8 Drawing Sheets

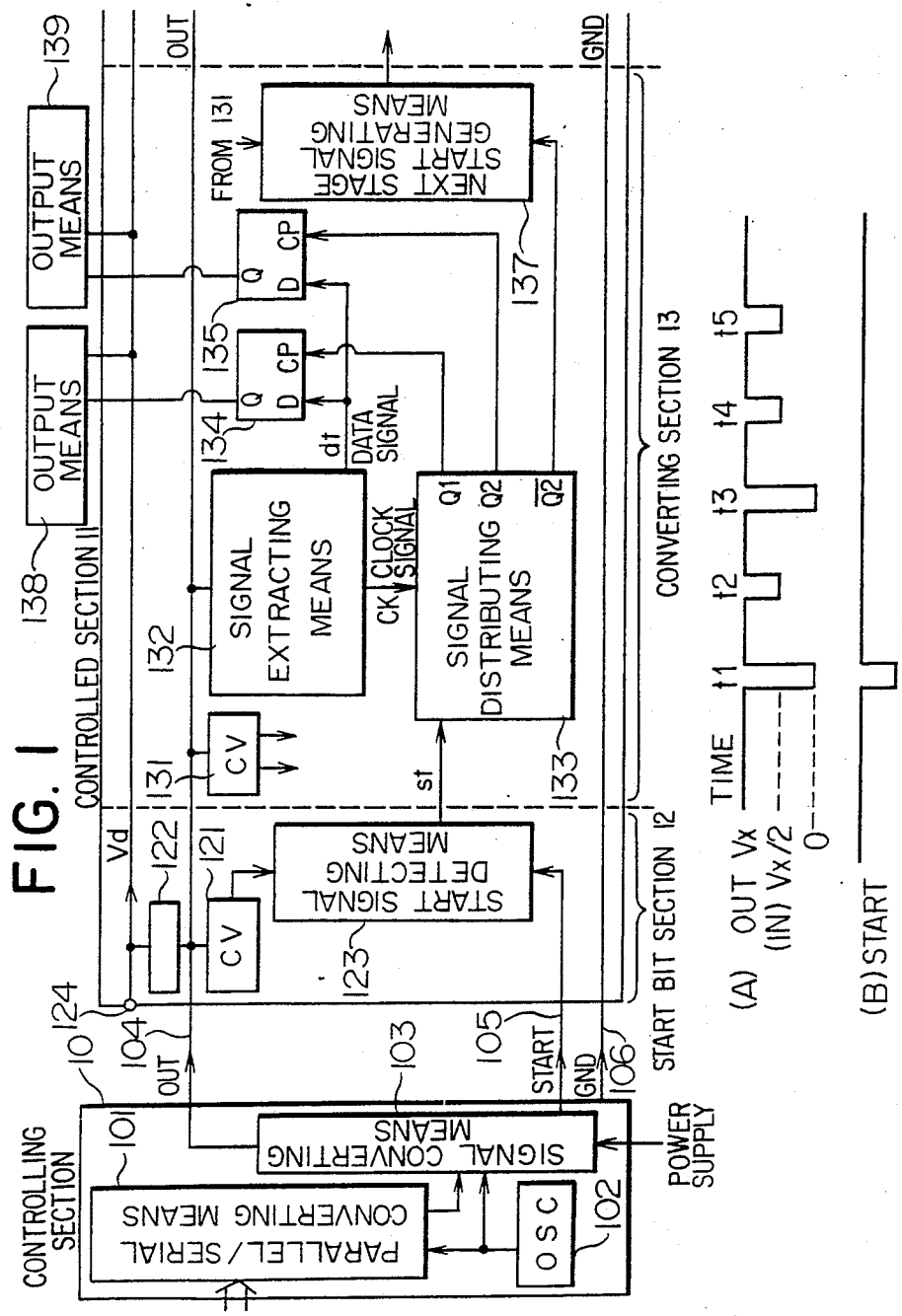

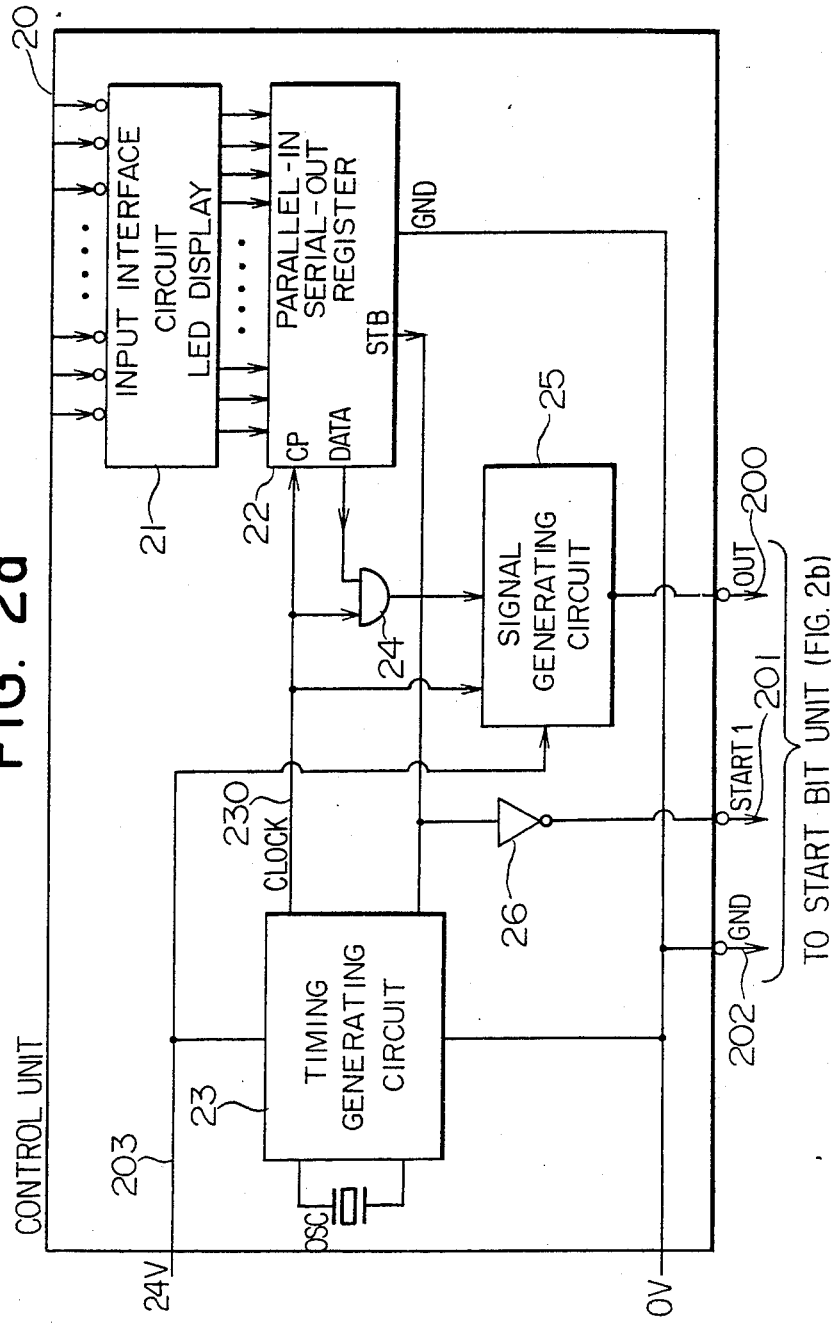

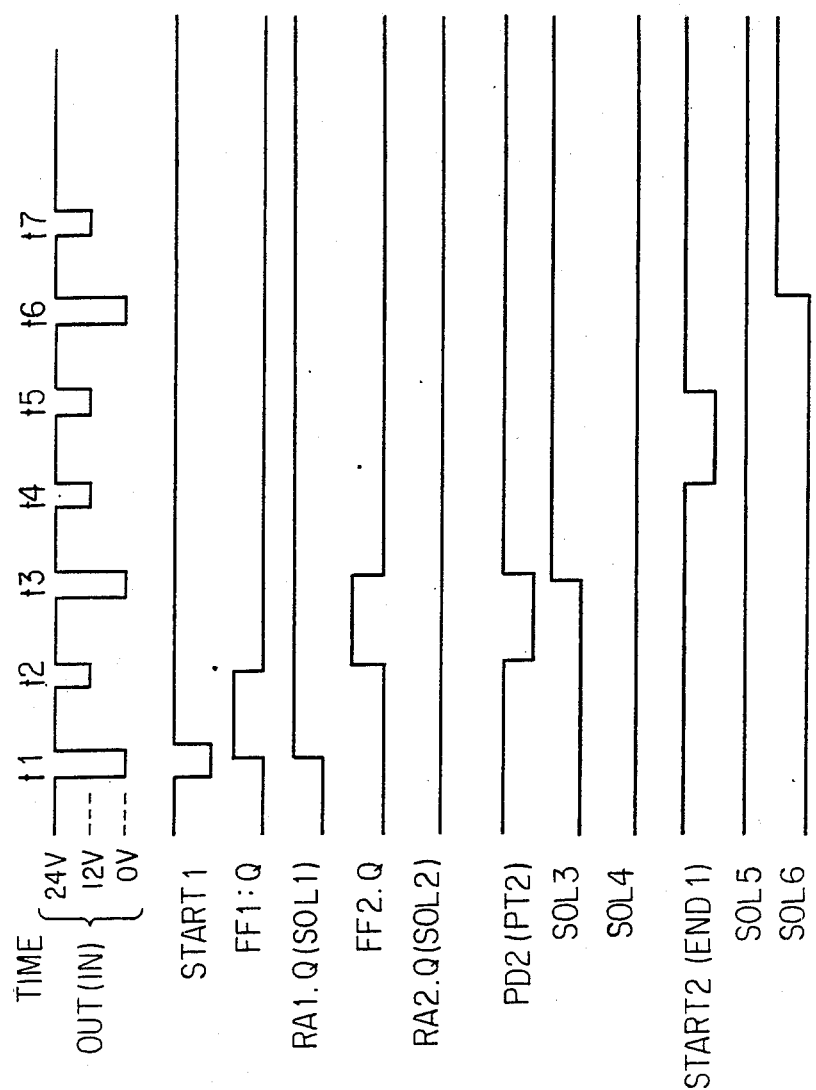

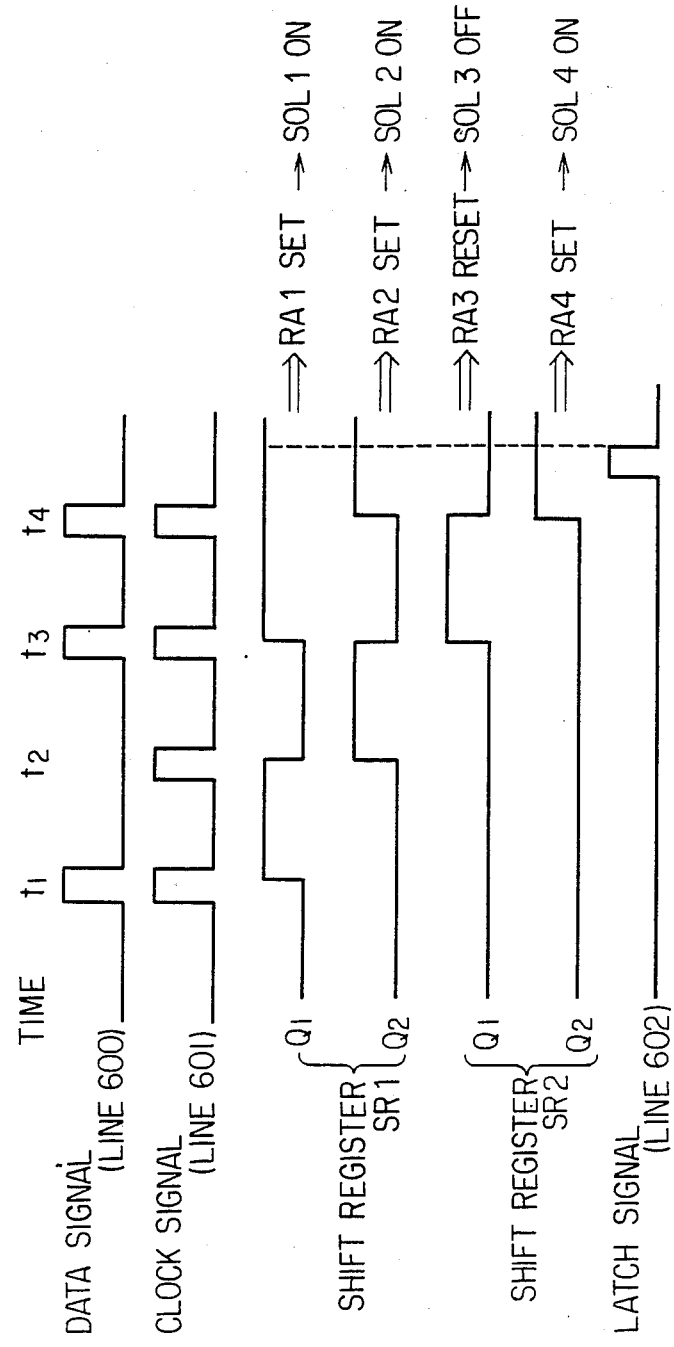

SIGNAL SERIAL/PARALLEL CONVERSION SYSTEM

BACKGROUND OF THE INVENTION

1. Field of the Invention

The present invention relates generally to a remote control system of serial-to-parallel (serial/parallel) conversion type. More particularly, the invention is concerned with an improvement of a remote control system of serial/conversion type which comprises a central control station and at least one local station located remotely from the central control station and connected thereto, wherein control pulse signals are serially sent from the central control station to the local station through the medium of a power transmission line, the local station being so implemented as to control in parallel a plurality of devices connected in response to reception of the control signals.

2. Description of the Prior Art

In the field of the automatic control technology, such a remote control system is well known and widely employed in which a multiplicity of devices, instruments or equipment such as, for example, solenoid valves or the like are controlled by control signals sent from a control station installed remotely from these objectives to be controlled.

In the remote control systems of the type mentioned above, there arise a lot of such applications where the device to be controlled are miniaturized and, provided in a great number, being arrayed densely to one another, as a result of which a great difficulty is encountered in making access to the individual devices. Consequently, provision of individual control signal lines, clock signal lines, power supply lines and others between the control station and the devices to be controlled involves much labor, large space and high costs. Besides, maintenance is attended with very troublesome procedure.

As the typical examples of the device to be controlled, there may be mentioned an automated tool such as, for example, an industrial robot which is designed to be hydraulically controlled with the aid of electromagnetic valves also referred to as the solenoid valve. In most of such automated tools or robots, a so-called manifold solenoid valve unit incorporating integrally a number of solenoid valves is used for controlling hydraulically various parts of the tool with a view to reducing the space occupied by the valves. However, in order to remotely control the individual solenoid valves realized in the form of the manifold valve unit from a control station, a number of lines inclusive of the control signal lines, the power supply line and others have to be installed between the control station and the individual solenoid valves, respectively, which of course involves high expenditure as well as a large space.

As an attempt for mitigating the difficulty mentioned above, there has already been developed a remote control system in which at least a local station is provided in association with the central control station, wherein the devices to be controlled are connected to the outputs of the local station. For controlling the devices, serial control signals are sent from the central control station to the local station where the serial signals are converted to parallel signals for controlling the devices connected to the outputs of the local station. With this arrangement, it is only necessary to interconnect the central control station and the local station. In other words, direct interconnection of the individual devices to be controlled and the central control station is rendered unnecessary. As a result, the number of the lines required for transmission of the control signals, electric power and others can be correspondingly decreased.

An example of the control system mentioned just above is disclosed in Japanese Patent Application Laid-Open No. 88081/1986 (JP-A-61-88081). For having a better understanding of the invention, this prior art control system will be described below by reference to FIGS. 6a and 6b of the accompanying drawings, in which FIG. 6a is a block diagram showing an arrangement of the prior art control system and FIG. 6b is a timing chart for illustrating operation of the same.

In FIG. 6a, a reference numeral 60 denotes a control circuit serving as a central station, and numerals 61 and 62 denote conversion circuits, respectively, which are adapted to generate signals for controlling solenoids SOL1 and SOL2, and SOL3 and SOL4 of solenoid valves (not shown) on the basis of signals sent from the control circuit or central control stations. Further, reference numerals 611 and 621 denote shift registers, respectively, each of which comprises two stages of flip-flops, and finally reference symbols RA1 to RA4 denote latch circuits for holding signals for driving the solenoids SOL1, SOL2, SOL3 and SOL4, respectively. Needless to say, each of the conversion circuits 61 serves as a local station.

Now, operation of the system shown in FIG. 6a will be described by reference to the timing chart shown in FIG. 6b. A data line 600, a clock line 601, a latch line 602 and, power lines 603–605 of the ground level, 5 V and 24 V, respectively, are provided for connecting each of the conversion circuits (local stations) 61 and 62 and the control circuit (central control station) 60 to each other. A data signal (control signal) capable to assuming logic "1" level (for energization of solenoid or ON control) or logic "0" level (for deenergization of solenoid or OFF control) is sent out onto the data line 600 in synchronism with the clock pulses generated at time points t1–t4 shown at the first row in FIG. 6b. In the case of the illustrated example, the data signal consists of a pulse sequence of "1", "0", "1" and "1" in this order.

Assuming now that the logic "1" pulse signal is applied to a shift terminal SI of the shift register 611 constituting a part of the conversion circuit (local station) 61 at the time point t1 from the central control station 10 via the data line 600 in synchronism with the clock signal inputted to the clock terminal CK of the shift register 611 via the clock line 601, then the pulse signal of logic "1" is outputted from an output terminal Q1 of the flip-flop constituting the first stage of the shift register 611 to be applied to a data input terminal of the latch circuit RA1. At that time, it is assumed that no latch signal is supplied via the latch line 602. Consequently, the output signal from the terminal Q1 is not latched by the latch circuit RA1.

Upon application of the data signal of logic "0" to the input terminal SI of the shift register 611 at the time point t2, the output from the first stage of the shift register 611 is then logic "0", while the second stage thereof outputs logic "1" at an output terminal Q2 in response to the shift of logic "1" from the first stage. At the time point t3, the data signal of logic "1" is applied to the terminal SI of the shift register, while the output of logic "1" from the output terminal Q2 of the second stage of the shift register 611 is applied to the shift input terminal SI of the shift register 621 of the conversion circuit 62 via connection DO-DI.

In this manner, there make appearance the data signals of logic "1", "1", "0" and "1", respectively, at the output terminals Q1 and Q2 of both the shift registers 611 and 621 at the time point t4, as can be seen in FIG. 6b. In succession, the latch signal is produced by the central control station 60 and applied to the input terminals D of the latch circuits RA1, RA2, RA3 and RA4, whereby the logic outputs "1", "1", "0" and "1" from the output terminal Q1 and Q2 of the shift registers 611 and 621 are latched and held by the latch circuits RA1, RA2, RA3 and RA4, respectively. In response to the outputs Q of these latch circuits, switches (not shown) provided in association with the outputs of the latch circuits are correspondingly operated, whereby the solenoids SOL1, SOL2 and SOL4 are electrically energized by electrically power supplied from the central control station 60 via the power supply line 605, while the solenoid SOL3 remains deenergized because the associated switch is not actuated due to the output of logic "0" at the output terminal Q of the latch circuit RA3. Needless to say, the energization of the solenoids SOL1, SOL2 and SOL4 results in actuation of the associated electromagnetic valves. Parenthetically, the power transmission line 605 serves for supplying power for operating the solenoids, while the power line 604 serves to supply power for energizing the conversion circuits 61.

As will be appreciated from the foregoing, the prior art remote control system shown in FIG. 6a requires as many as six lines in total for the transmission of the command signal, control signals and power from the central control station to the local stations, involving no little expensiveness.

SUMMARY OF THE INVENTION

It is therefore an object of the present invention to eliminate the drawbacks of the prior art described above and provide an improved remote control system in which the number of lines for transmission of various signals and power can be significantly decreased.

In view of the above and other objects which will be apparent as description proceeds, there is provided according to a general aspect of the present invention a remote control system of serial-to-parallel conversion type which comprises a central control station having a power supply source and at least one local station located remotely from the central control station and having no power supply source, the local station being supplied with electric power from the central control station through a power transmission line, wherein control pulse signals are serially sent from the central control station to the local station through the medium of the power transmission line, the local station being so implemented as to control in parallel a plurality of devices connected thereto in response to reception of the control pulse signals. The central control station includes clock signal generating means for generating a train of clock pulses, start signal generating means for generating a start signal in synchronism with a start clock pulse of the clock pulse train, and signal generating means for generating binary control information in synchronism with the clock pulse, wherein the binary control information and the clock pulses are superposed on the electric power by the signal generating means to be sent out onto the power transmission line. The local station includes a power restoration means connected to the power transmission line for generating a source voltage required for driving the devices to be controlled by eliminating the binary control information and the clock pulses, start signal detecting means for detecting the start signal generated by the start signal generating means, signal extracting means for taking out the clock pulses and the binary control information from the power transmission line, signal distribution means responsive to the start signal and the clock pulses for generating distribution signals indicating destinations to which the binary control information is to be supplied, and output means provided at the destinations for generating control signals on the basis of the binary control information supplied from the signal extracting means and the distribution signals for thereby controlling in parallel the states of the devices connected to the local station at the positions corresponding to said destinations and driven by said power.

The objects, features, advantages and attainments of the present invention will become apparent to those skilled in the art upon a reading of the following detailed description when taken in conjunction with the drawings.

BRIEF DESCRIPTION OF THE DRAWINGS

In the course of the following detailed description, reference will be made to the attached drawings, in which:

FIG. 1 is a block diagram showing a general arrangement of the remote control system according to an exemplary embodiment of the present invention;

FIG. 2a is a block diagram showing a circuit configuration of a central control station employed in of the remote control system shown in FIG. 1;

FIG. 3 shows a timing chart for illustrating operation of the remote control system according to the embodiment to the invention;

FIG. 6b is a timing chart for illustrating operation of the remote control system shown in FIG. 6a.

DESCRIPTION OF THE PREFERRED EMBODIMENTS

Figure 2B:
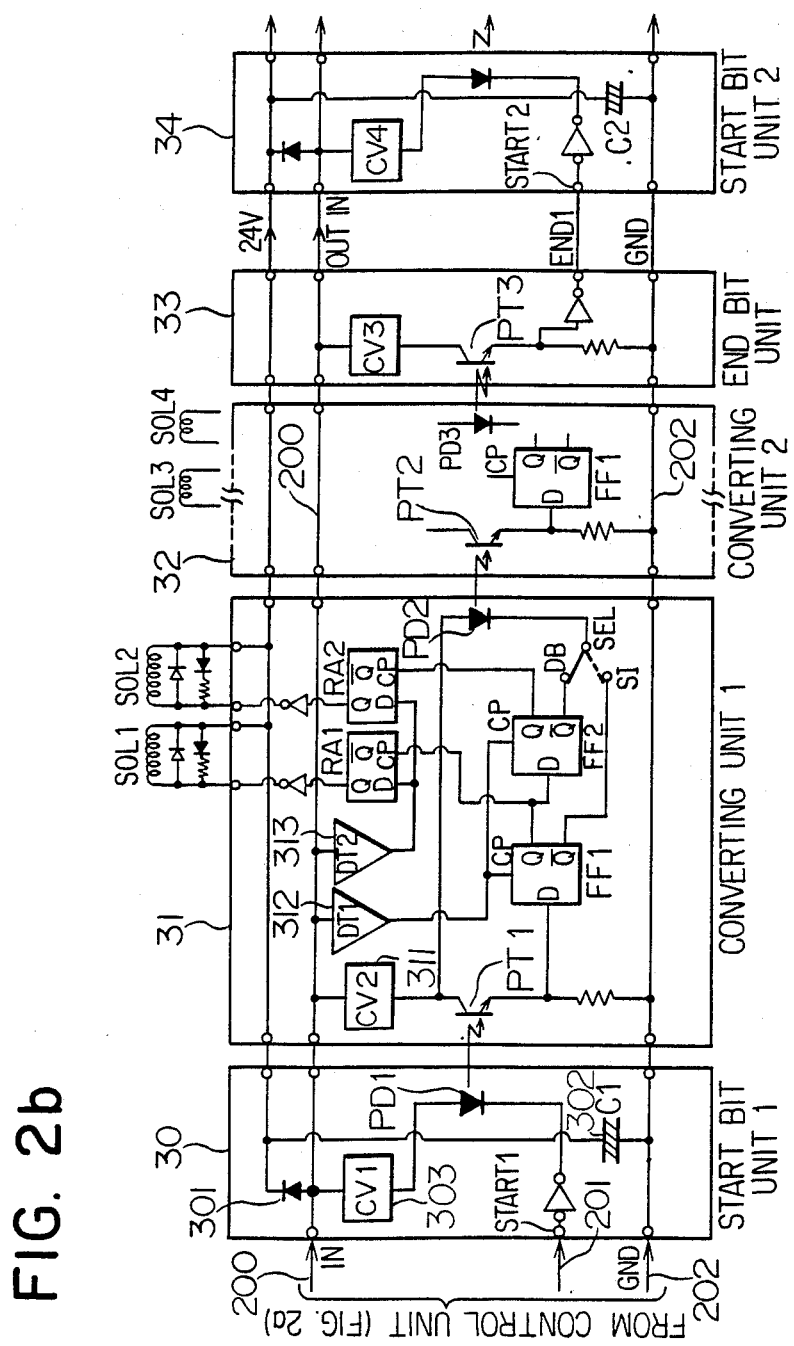
FIG. 2b is a block diagram showing circuit configurations of various units constituting local stations in the remote control system shown in FIG. 1.

Now, the present invention will be described in detail in conjuction with referred or exemplary embodiments thereof by reference to the accompanying drawings.

In the first place, description will be made of the basic concept underlying the remote control system according to the invention by referring to FIG. 1.

In FIG. 1, a reference numeral 10 generally denotes a control station which is also referred to as the central control station and which includes a parallel-to-serial (parallel/serial) conversion circuit 101, a clock signal generator 102 composed of an oscillation circuit (OSC), and a signal conversion circuit 103. A reference numeral 11 generally denotes a local station which includes a start bit unit 12 and a conversion unit 13. Although only one local station is shown in FIG. 1, it should be understood that there can be installed a desired number of serially interconnected local stations in depedence on objectives to be controlled. The start bit unit 12 is composed of a power restoration circuit 122 for restoration electric power to electrically energize or drive the objectives or loads to be controlled such as, for example, solenoids of and 139 of the local station. The D.C power superposed with the serial signal pulses and the clock pulses (refer to FIG. 1 at (A)) outputted from the signal conversion circuit 103 is then sent out onto a line 104 labeled "OUT".

Additionally, the signal conversion circuit 103 is so designed as to generate a start signal "START" in synchronism with the start of the pulse train superposed on the power as mentioned above. Refer to FIG. 1 at (B). The start signal is sent out onto a line 105 labeled "START". Incidentally, a reference numeral 106 denotes an earth signal line (GND) of the ground potential.

The D.C. power outputted from the signal conversion circuit 103 thus assumes such a waveform as illustrated in FIG. 1 at (A). More specifically, a level $V_x$ represents the voltage level of the D.C. power supply source (in volts), $V_{x/2}$ represents the voltage level corresponding to the command or control signal pulse of logic "0" level, and 0 represents the voltage level (zero volt) corresponding to the command or control signal pulse of logic "1", wherein the pulses of logic "1" and "0" are in synchronism with the clock pulses, as described hereinbefore.

Upon reception of the pulse-superposed power "OUT" by the local station 11 via the line 104, the load driving power restoration circuit 122 regenerates the power having a voltage level substantially equal to the level $V_x$ for energizing or driving the loads connected to the ouput circuits 138 and 139 by eliminating the pulse components from the input pulse-superposed power. The circuit configuration of this power restoration circuit 122 will be made apparent later on. The input pulse-superposed power is also supplied to the stubilized constant voltage power generating circuits 121 and 131, whereby a constant voltage of a level lower than $V_x$ is generated to be supplied electomagnetic valves, a stabilizer or constant-voltage power generating circuit 121 serving as a power supply source for driving electric or electronic components constituting the start bit unit 12, and a start signal detecting circuit 123. On the other hand, the conversion unit 13 includes as constant-voltage power generating circuit 131 serving as a power supply source for the various parts constituting the conversion unit 13, a signal extracting circuit 132 for extracting a clock signal and data (or commands) signals, a signal distributing circuit 133 constituted by two stages of flip-flop circuits, latch circuits 134 and 135 for latching the data signals, a start signal generating circuit 131 for generating a start signal to be supplied to a succeeding local station, and output circuits 138 and 139 each of which may be constituted, for example, by a switch.

In operation of the remote control system implemented generally in the arrangement outlined above, a control command is externally inputted (as indicated by an arrow in FIG. 1) to the parallel/serial conversion circuit 101 of the central control station 10 in the form of parallel data bits through an appropriate input unit (not shown). The parallel/serial conversion circuit 101 having a structure which will be described in more detail hereinafter converts the input data bits into serial signal pulses under the timing commanded by a clock signal generated by the clock signal generator 102. The serial signal pulses as generated are inputted to the signal conversion circuit 103 together with the clock signal. As will described in more detail hereinafter, the signal conversion circuit 103 serves for the function to superpose the serial signal pulses and the clock pulses on a D.C. power supplied from a conventional D.C. power supply source and having a sufficiently high voltage level to drive the loads connected to the output circuits 138 as the source voltage to the start signal detecting circuit 123 (from the circuit 121) and supplied to the signal extracting circuit 132, the signal distribution circuit 133, the latches 134 and 135 and the succeeding stage start signal generating circuit 131 (from the circuit 131), all of which are constituted by electronic circuits of low power consumption type. The output of the load driving power restoration circuit 122 is connected to a line $V_d$ which in turn is connected to the power input terminals of the output circuits 138 and 139 to which the loads (not shown) to be controlled by the present remote control system are connected. In a preferred embodiment, the power line $V_d$ may additionally be connected to a terminal 124 of a D.C. power supply source for emergency so that the loads can be operated even when the power supply from the central control station 10 should be interrupted for some reason.

Figure 6A:
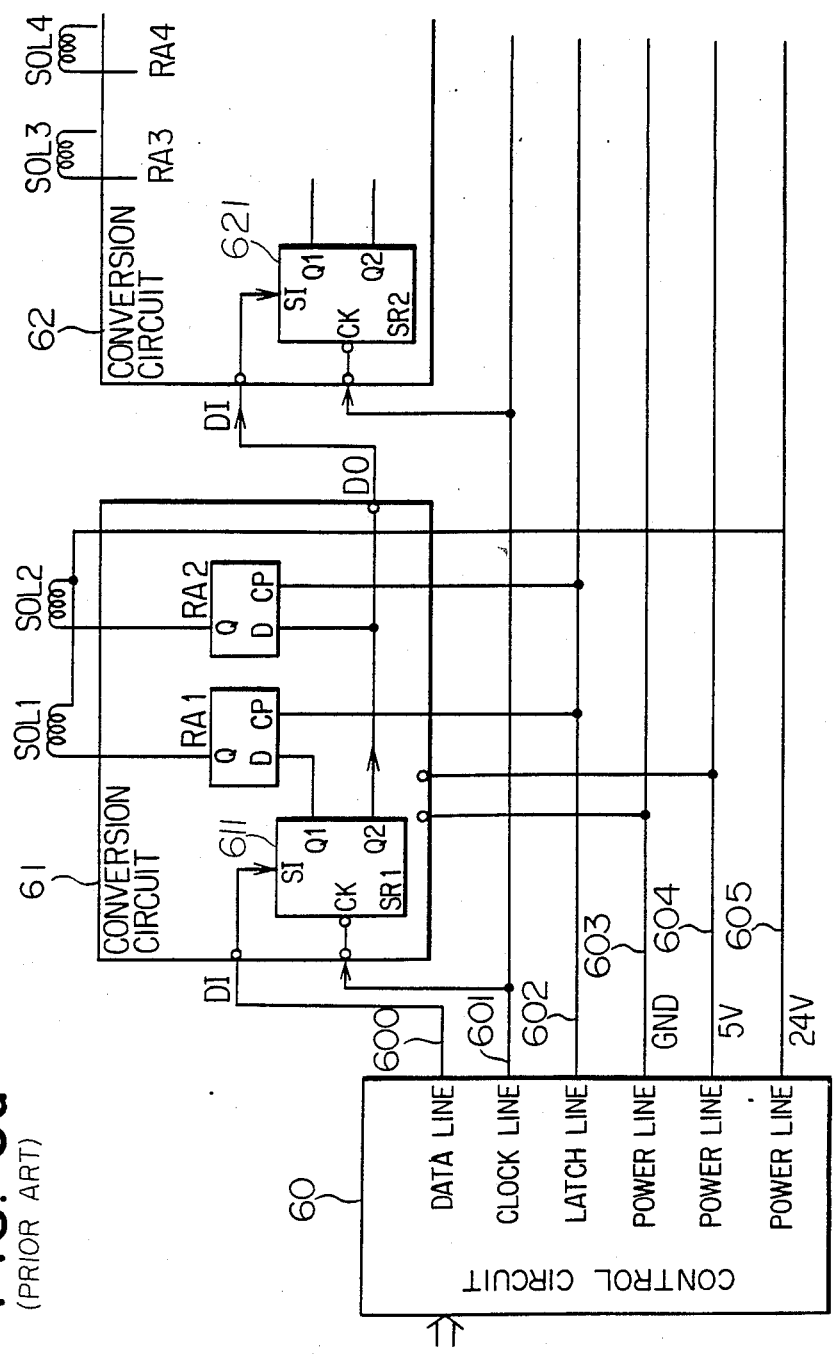
FIG. 6a is a block diagram showing a structure of a remote control system known heretofore.

The start signal detecting circuit 123 of the start bit unit 12 activated by the constant voltage power supply circuit 121 detects the start signal st supplied via the signal line (START) 105 in synchronism with the first pulse ($t_1$) of logic "1" (see FIG. 1 at (A)). The detected start pulse is supplied to the signal distribution circuit 133 which is constituted by first and second stages of a shift register of such a configuration as described hereinafter in conjunction with FIG. 6a.

On the other hand, the signal extracting circuit 132 connected to the power line 104 detects the superposed data signal pulses discriminatively with regard to the pulse levels to thereby output the detected clock pulses ck and the data signal pulses of logic level "1" and "0" designated generally by dt.

The clock pulse ck outputted from the signal extracting circuit 132 applied to the signal distributing circuit 133 to allow the logic "1" pulse outputted from the start signal detecting circuit 123 to be inputted to the first stage of the shift register consituting the signal distribution circuit 133, resulting in that the pulse of logic level "1" is produced from the output terminal Q1 of the first stage of the signal distribution circuit 133 to be applied to a clock input terminal CP of latch circuit 134.

Thus, at the timing of the clock pulse ck, the first pulse of logic "1" (pulse $t_1$ shown in FIG. 1 at (A)) inputted to a control pulse input terminal D of the latch circuit 134 is latched by the latter. As a result, an output signal is produced from an output terminal Q of the latch circuit 134 to thereby turn on the output circuit 138 which may be constituted, for example, by a switch. Consequently, the electric power generated by the power restoration circuit 122 is supplied to the load connected to the output circuit 138 to be electrically energized. The load may be consituted, for example, by a solenoid of an electromagnetic valve, an electric motor, a relay or the like, although not shown.

The pulse making appearance on the line 104 in succession to the first pulse, i.e. the pulse appearing at the time point $t_2$ in the case of the pulse train illustrated in FIG. 1 at (A) is logic "0". Consequently, the pulse extracting circuit 132 produces as the outputs thereof the clock pulse ck and the data signal pulse dt of logic "0". The clock pulse ck is applied to the signal distributing circuit 133, as the result of which the data of logic "1" set at the first stage of the signal distributing circuit 133 at the preceding time point $t_1$ is shifted to the second stage of the circuit 133, whereby the data signal pulse of logic "1" is generated at the output terminal Q2 to be applied to the clock input terminal CP of the latch circuit 135. This results in that the signal pulse of logic "0" outputted from the pulse extracting circuit 132 is latched and held by the latch circuit 135. At this time, no output signal is produced from the output terminal Q of the latch circuit 135. Accordingly, the output circuit 139 remains inoperative.

Simultaneously with the output of the clock pulse from the output terminal $Q_2$ of the signal distribution circuit 133, the succeeding stage start signal generating circuit 137 is driven in response to the signal appearing at the output terminal Q2 of the signal distributing circuit 133, whereby the start signal is supplied to the succeeding conversion unit.

As will now be appreciated from the above description, the control data pulse train transmitted serially via the transmission line 104 undergoes serial/parallel (serial-to-parallel) conversion in the conversion unit 13 of the local station 11, whereby the output circuits 138 and 139 connected to the output side of the conversion unit 13 as well as those of the succeeding conversion unit 30 (not shown in FIG. 1) are set to the states of "ON", "OFF", "ON", "OFF" and "OFF", respectively, in response to the control data pulse train illustrated in FIG. 1 at (A) on the assumption that three output circuits and three latch circuits are provided in the succeeding conversion unit with the signal distribution circuit being constituted by a three-stage shift register. The abovementioned state is held as it is until the next control data pulse train is issued by the central control station 10.

In the remote control system shown in FIG. 1, the conversion unit 13 of the local station 11 is so configured as to control the two output circuits 138 and 139. It should however be understood that a disired number of the output circuits can be provided, as occasion requires, by providing a corresponding number of the latch circuits with the signal distributing circuit 133 being constituted by the shift register having a corresponding number of shift stages.

It should further be added that the line 105 dedicated to the transmission of the start signal can be spared. In that case, the start signal may be transmitted via the signal/power transmission line 104, wherein the level of the start signal is differentiated from those of the control data pulses or alternatively the pulse width of the start signal may be differentiated from that of the control data pulse so that the former can be discriminated from the latter. Further, in place of differentiating the control data pulses of logic "1" and "0" in respect to the level from each other, it is also possible to impart these pulses with different pulse widths or durations.

Next, referring to FIGS. 2a and 2b and FIG. 3, description will be made in detail of the structures and/or operations of the central control station and the local station as well as the individual circuits incorporated in these stations.

FIG. 2a shows in a block diagram a circuit configuration of the central control station and FIG. 2b shows in a block diagram a circuit configuration of the local station.

In FIG. 2a, a reference numeral 20 generally denotes the central control station, a numeral 21 denotes an input interface circuit equipped with a LED display function for displaying the current control state, numeral 22 denotes a parallel-in/serial-out register which constitutes the parallel/serial conversion circuit 101 shown in FIG. 1, numeral 23 denotes a timing generator circuit constituting the clock generator 102 shown in FIG. 1, and numeral 25 denotes a signal generating circuit which cooperates with an AND gate 24 to constitute the signal conversion circuit 103 shown in FIG. 1. On the other hand, in FIG. 2b, a reference numeral 30 generally denotes a first start bit unit corresponding to that designated by the numeral 12 in FIG. 1. Reference numerals 31 and 32 denote the conversion units, respectively, each of which corresponds to that designated by 13 in FIG. 1. A numeral 33 denotes an end bit unit, and 34 denotes a second start bit unit corresponding to the first one. Reference numerals 303 and 311 denote the constant voltage power supply circuits for the first start bit unit 30 and the first conversion unit 1, respectively, and correspond to those designated by 121 and 131 in FIG. 1. Further, reference characters CV3 and CV4 also denote the constant voltage power supply circuits for the associated units 33 and 34, respectively. Each of the constant voltage power supply circuits can be is constituted by a Zener diode, a capacitor and a resistor in a configuration well known in the art, to generate a power of low voltage level for energization of the electronic circuits incorporated in the associated units. Reference characters FF1 and FF2 denote flip-flop circuits which cooperate to constitute the shift register serving as the signal distribution circuit 133 shown in FIG. 1. A reference symbol DT1 denotes a circuit for discriminating the clock signal, and a symbol DT2 denotes a circuit for discriminating the logical values "0" and "1" of the control data pulse signal. These descrimination circuits DT1 and DT2 constitute the signal extracting circuit 132 shown in FIG. 1. Reference symbols RA1 and RA2 denote latch circuits corresponding, respectively, to those designated by 134 and 135 shown in FIG. 1. Further, reference symbols SOL1, SOL2 and so forth represent the solenoids of electromagnetic valves to be controlled by the present remote control system. A symbol SEL denotes a selector switch capable of being thrown to a position DB or a position SI. When the selector switch SEL is at the position SI, the control is transferred from the first conversion unit 31 to the second conversion unit 2 in succession to the turning-on or turning-off of only the solenoid SOL1, while at the position DB of the selector switch SEL, the abovementioned control transfer is effectuated only after both the solenoids SOL1 and SOL2 have been controlled. Finally, a reference numeral 301 denotes a diode, 302 denotes a smoothing capacitor, PD denotes photodiodes and PT denote phototransistors, respectively.

The central control station 20 shown in FIG. 2a and the local station (30, 31, 32, 33) are interconnected through the signal/power transmission line 200 (corresponding to 104 in FIG. 1), the start signal transmission line 201 (105 in FIG. 1) and the ground potential line 202 (106 in FIG. 1).

Now, described will be turned to the operation of the remote control system shown in FIGS. 2a and 2b with the aid of a timing chart shown in FIG. 3.

Referring first to FIG. 2a, the input interface ciruit 21 is externally supplied with control data signals in parallel which may be generated by a computer or the like on the basis of detection signals of various sensors installed at the site of the local station(s) for detecting the operating states of the objectives such as, for example, an industrial robot controlled hydraulically by the electromagnetic valves. The parallel control data outputted from the interface circuit 21 are supplied to the parallel-in/serial-out register 22.

The parallel-in/serial-out register 22 is supplied with the clock pulse signal 230 form the timing generator circuit 23 at a clock terminal CP. In response to the clock pulse applied to the terminal CP, one data bit loaded at the start bit postion in the parallel-in/serial-out register 22 is shifted to be outputted from an output terminal STB as the start signal START1, as illustrated in FIG. 3 at the second row labeled "START1", the start signal being then sent out onto the start signal line 201 through a driver circuit 26. At the same time, the control data located at the start bit position of the register 22 is applied to one input terminal of the AND circuit 24 from the terminal DATA of the register 22, the other input terminal of the AND circuit 24 being supplied with the clock signal.

Through the AND circuit 24, the clock signal and the control data signal are logically ANDed. The output of the AND circuit 24 is supplied to the signal generating circuit 25 which may be constituted by a conventional mixer circuit and has inputs connected to the output of the AND circuit 24, the timing generator circuit 23 and the power supply line 203, for example, of 24 volts, to thereby output the power superposed with the clock pulses and the control data pulses which coincide with each other in the timing, the output of the signal generating circuit 25 being sent out onto the signal/power transmission line 200. The waveform of the output of the signal generating circuit 25 is illustrated in FIG. 3 at the first row labeled "OUT". More specifically, in response to the control pulse of logic "1" outputted from the AND circuit 24, the signal generating circuit 25 produces a pulse of zero volt (ground potential) while producing a pulse having a amplitude of 12 volts in response to the logic "0" outputted form the AND circuit 24 in synchronism with the clock signal. During the inter-pulse interval, the output of signal generating the circuit 25 is constant at 24 volts.

Description will now be directed to the operation of the local station shown in FIG. 2b by referring to FIG. 3.

Referring to FIG. 2b, each of the local stations includes a cascaded connection of the start bit unit, the first and second conversion units 31 and 32 and the end bit unit 33 (described hereinafter) and connected to the signal/power transmission line 200 and the ground level line 202. The stabilized constant voltage power generating circuits CV incorporated in each of the units is constituted by a Zener diode, a capacitor and a resistor in a configuration known in the art and generates a constant source voltage for the individual electronic circuits incorporated in the associated units. A diode 301 and a capacitor C1 of a large capacity cooperate to constitute the power restoration circuit 122 described hereinbefore in conjunction with FIG. 1 for generating the electric power by eliminating the control data pulses so as to be capable of driving the solenoids SOL connected to the conversion units at the output circuits thereof (not shown in FIG. 2b but correspond to those denoted by 138 and 139 in FIG. 1, respectively).

The start signal "START" is applied to the input terminal START1 of the start bit unit 30, whereupon the light emission diode PD1 emits light, in response to which the phototransistor PT1 constituting an input part of the first conversion unit 31 is turned on to output a signal of logic "1" from the emitter. The signal of logic "1" is inputted to a data input terminal D of the flip-flop circuit FF1. At this time point, a clock pulse indentification signal is generated by the clock signal discriminating circuit 312 (DT1) to be applied to a clock terminal CP of the flip-flop FF1. As a result, the flip-flop circuit FF1 is switched to the set state to produce a pulse signal of logic "1" from the output terminal Q (refer to FIG. 3 at first, second and third rows).

On the other hand, the data signal discriminating circuit 313 (DT2) discriminates the levels of the control data pulses on the signal/power transmission line 200 for thereby outputting correspondingly the data pulses of logic "0" and "1". The output data pulse signal is supplied to the data input terminals D of the latch circuits RA1 and RA2, respectively.

Consequently, the latch circuit RA1 is switched to the set state in response to the first data pulse of logic "1" outputted from the data signal discriminating circuit 313 and the Q output terminal of the flip-flop circuit FF1 to produce an output signal (refer to FIG. 3 at the row labeled "Q of RA1"). In response to the output signal of the latch circuit RA1, the output circuit which may be constituted by, for example, an electronic switch is closed to allow the power smoothed by the diode 301 and the capacitor 302 (i.e. circuit 122 in FIG. 1) to be applied to the solenoid SOL1.

At the time point t2 corresponding to the next clock pulse, the logic "1" state of the flip-flop circuit FF1 is shifted to the succeeding flip-flop circuit FF2 in response to the clock pulse generated by the clock signal discriminating circuit 312, as a result of which the flip-flop circuit FF2 is switched to the set state, whereby the output of logic "1" is supplied to the terminal D of the latch circuit RA2. At this time point t2, the data pulse is assumed to be logic "0" as shown at the first row "OUT" in FIG. 3. Accordingly, the latch circuit RA2 remains in the reset state. Thus, no control signal for activating the solenoid SOL2 is outputted from the output terminal Q of the latch circuit RA2.

In case the selector switch SEL is set at the position DB, the light emission diode PD2 is activated when the Q-output of the flip-flop circuit FF2 is logic "1" at the time point t2 corresponding to the second clock pulse, resulting in that the phototransistor PT2 of the second conversion unit 32 is turned to the conducting state. However, at the time point the phototransistor PT2 becomes conductive, the second clock pulse (t2) has already disappeared. Accordingly, the flip-flop circuit FF1 of the second conversion unit 32 (having the structure identical with that of the first conversion unit 31) is not operated at the time point t2 but operated at the succeeding time point t3 in response to the clock pulse and the data pulse, whereby the latch circuit RA1 (not shown) and hence the solenoid SOL3 of the second conversion unit 32 are driven. At the time point t4, the latch circuit RA2 (not shown) of the second conversion unit 32 remains in the reset state without driving the associated soleniod SOL4. In this way, the solenoids SOL3 and SOL4 of the second conversion unit 32 are brought to the on-state and off-state at the time points t3 and t4, as can be seen in FIG. 3 at the rows labeled "SOL3" and "SOL4".

Connected in succession to the second conversion unit 32 is the end bit unit 33 which is composed of a phototransistor PT3 and an amplifier connected in a conventional circuit configuration. Upon reception of ligt rediation from the light emission diode PD3 of the second conversion unit 32, the phototransistor PT3 and the amplifier of the end bit unit 33 generates an end bit signal which is transmitted from a terminal END1 of the end bit unit 33 to an input terminal START2 of the start bit unit 34 belonging to the succeeding local station. In response to the start bit START2, operation similar to that described above in conjunction with the first local station can take place in the second local station, whereby the solenoids SOL5, SOL6 and so forth (not shown) are controlled at time points t5, t6 and so forth in such a manner as illustrated in FIG. 3 at the rows labeled "SOL5" and "SOL6".

In the case of the illustrative embodiment described above, the start bit unit 30, the frist and second conversion units 31 and 32 and the end bit unit 33 are operatively connected through optical couplings each realized by the light emission diode and the phototransistor. It should however be understood that the invention is not restricted to such arrangement. A direct connection by using a connector plug, by way of example, can equally be adopted.

The local station including the units 30, 31, 32 and 33 shown in FIG. 2b can be installed in a desired number by connecting additionally a corresponding number of the stations in cascade. This expansion capability features an aspect of the present invention.

In an experiment, it is found that the remote control system operates satisfactorily with the clock pulse signal (and data pulse signal) having a duration of 4 $\mu$sec. and a pulse repetition period of 32 $\mu$sec..

Figure 4:
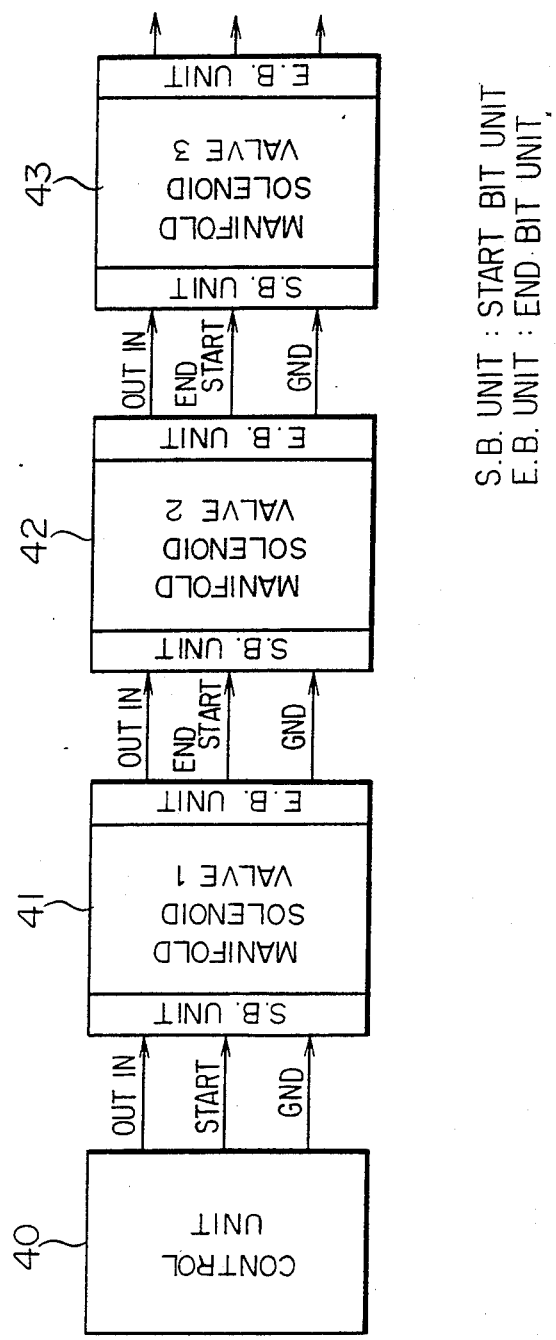
FIG. 4 is a schematic block diagram showing a practical example of the remote control system to which the present invention can be applied.

FIG. 4 shows, by way of example, an application of the present invention. More specifically, FIG. 4 is a block diagram showing schematically an arrangement of the inventive remote control system applied to manifold electromagnetic valve systems. In the figure, the control unit 40 constitutes the central control station and has a structure shown in FIG. 2a. One local station is constituted by one start bit unit, one manifold magnetic valve unit integrally combined with the conversion unit and one end bit unit. A desired number of the manifold magnetic valve systems can be controlled by connecting them in cascade without need for increasing the number of the lines interconnecting the central station and the local stations.

Figure 5:
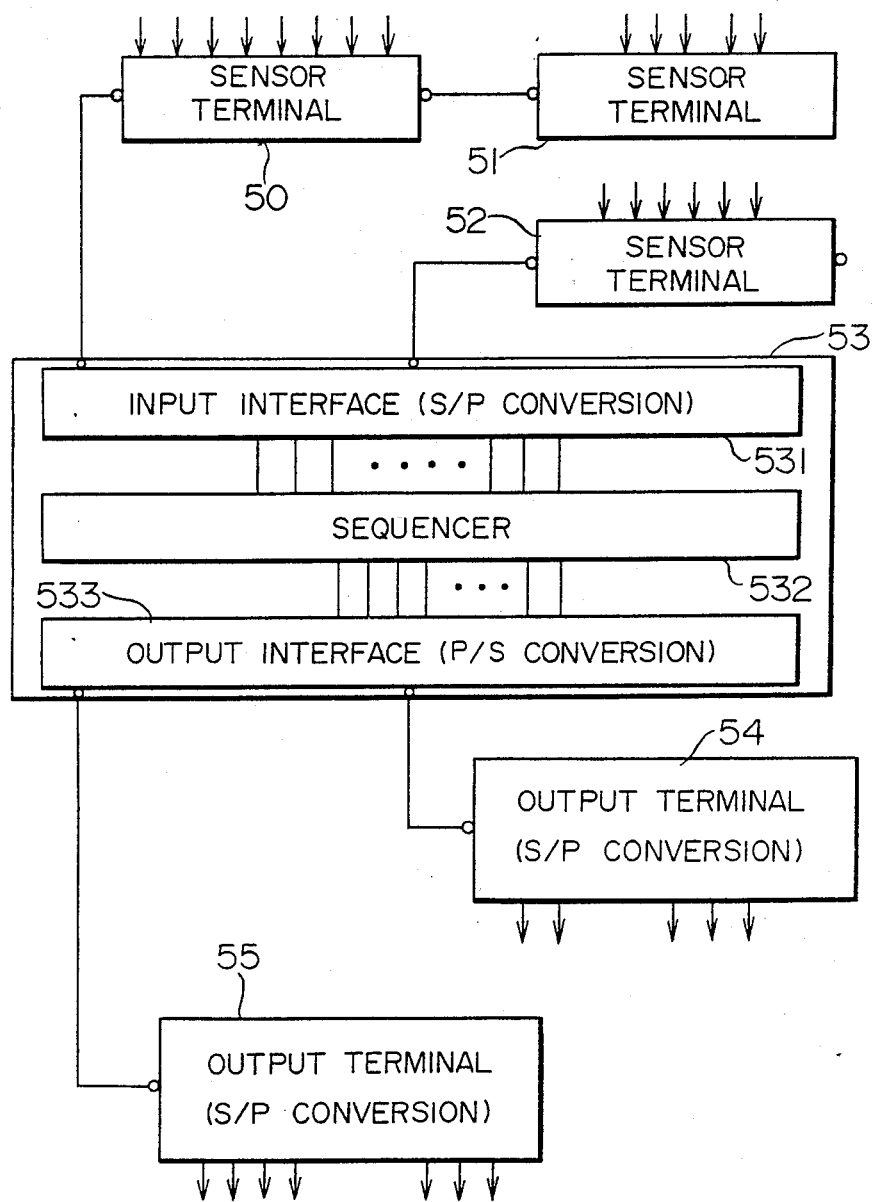
FIG. 5 is a schematic block diagram showing another example of application of the invention.

Another application of the invention is shown in FIG. 5, by way of example only.

In FIG. 5, reference numerals 50 to 52 denote sensor terminals, respectively, 53 denotes a control unit or the central control station, and numerals 54 and 55 denote output terminals, respectively.

Signals generated by individual sensors and indicating the states of associated devices such as temperature, angle, electrical energization/deenergization, position and others are inputted in parallel to the associated sensor terminals 50 to 52, respectively, which are then inputted serially to the control unit ( central control station) 53, wherein the serial signal is converted into a parallel signal through an input interface 531 to be inputted to a sequencer 532 which in turn outputs a control signal of a sequence programmed in accordance with the contents of the input signal, the control signal being supplied in parallel to an output interface 533. The output interface 533 converts the parallel input to a serial signal which is supplied to the associated output terminal. In that case, the output interface 533 outputs the serial signal to a plurality of the output terminals 54 and 55 simultaneously. However, when the number of the output devices (e.g. solenoids) is smaller than a predetermined number, only one serial output signal of the output interface 533 is utilized.

As will be appreciated from the foregoing description, it is possible according to the teaching of the present invention to control a number of devices to be controlled with the number of the lines for operating and controlling the the same being decreased to a possible minimum. By virtue of this feature, a large number of the devices to be controlled can be installed within a narrow space while the labor as well as expenditure involved in wring the lines can remarkably be reuced.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly, all suitable modifications and equivalents may be restored to, falling within the scope of the invention.

What is claimed is:

1. A remote serial-to-parallel conversion type control system, comprising:

a power transmission line;

a central control station connected to a power supply source, said power supply source supplying an electric power signal, said central control station including clock signal generating means for generating a train of clock pulses, start signal generating means for generating a start signal in synchronism with a start clock pulse of said clock pulse train, and signal generating means for generating binary control information in synchronism with said clock pulses, wherein said binary control information and said clock pulses are superposed on said electric power signal by said signal generating means and sent out of said central control station on said power transmission line; and, at least one local station located remotely from said cental control station and having no power supply source, said local station being connected to said power transmission line for receiving said electric power signal and superposed binary control information and clock pulses from said central control station, wherein control pulse signals are serially sent from said central station to the local station through the medium of said power transmission line, said local station being so implemented as to control in parallel a plurality of devices connected thereto in response to receipt of said control pulse signals, said local station including power restoration means connected to said power transmission line for generating a source voltage required for driving said devices to be controlled, said power restoration means eliminating said binary control information and said clock pulses and outputting a stabilized power signal, start signal detecting means for detecting said start signal generated by said start signal generating means, signal extracting means for taking out said clock pulses and said binary control information from said power signal on said transmission line, signal distribution means responsive to said start signal and said clock pulses for generating distribution signals indicating destinations to which said binary control information is to be supplied, and output means provided at said destinations for generating control signals on the basis of said binary control information supplied from said signal extracting means and said distribution signals for controlling in parallel the states of said devices connected to said local station at the positions corresponding to said destinations and driven by said power.

2. A remote of serial-to-parallel conversion type control system according to claim 1, wherein said binary control information superposed on the electric power signal in synchronism with said clock pulses is in the form of voltage pulses having a substantially constant predetermined DC voltage levels during a period intervening said clock pulses and capable of assuming either one of two different DC voltage levels during a period of said clock pulse, said two different DC voltage levels representing said binary control information.

3. A remote system of serial-to-parallel conversion type control system according to claim 2, wherein said signal extracting means extracts said clock pulses and said binary control information through discrimination of said DC voltage levels.

4. A remote serial-to-parallel conversion type control system according to claim 1, wherein said binary control information is in the form of DC voltage pulses having a substantially constant predetermined DC voltages level during a period intervening said clock pulses and capable of assuming either one of two different pulse widths during a period of said clock pulse, said two different pulse widths representing said binary control information.

5. A remote serial-to-parallel conversion type control system according to claim 4, wherein said signal extracting means extracts said clock pulses and said binary control information through discrimination of said pulse widths.

6. A remote serial-to-parallel conversion type control system according to claim 1, wherein said signal distributing means is composed of a shift register for generating said distribution signals by shifting said start signal detected by said start signal detecting means by said clock pulses extracting by said signal extracting means.

7. A remote serial-to-parallel conversion type control system according to claim 1, wherein said local station includes, in addition to said power restoration means for generating a stabilized power signal for driving said devices connected to said output means, local station power generating means for serving as a stabilized power sources for the circuit means incorporated in said local station.

8. A remote serial-to-parallel conversion type control system according to claim 1, further including an end bit unit for generating the start signal to be supplied to a second local station which can be installed in succession to the first mentioned local station, said second local station having a same structure as that of the first mentioned local station.

9. A remote serial-to-parallel conversion type control system according to claim 8, wherein said local station is physically divided blockwise into a start bit unit including said start signal detecting means, a conversion unit including said signal extracting means, said signal distribution means and said output means, and said end bit unit, and wherein said units are each provided with interconnection means.

10. A remote serial-to-parallel coversion type control system according to claim 1, wherein said start signal is sent to said local station by way of said power transmission line in the form of a pulse which can be discriminated from said binary control information.

11. A remote serial-to-parallel conversion type control system according to claim 1, wherein said signal is sent to said local station by way of a line wired between said between central control station and said local station.

* * * * *